United States Patent [19]

Johnson et al.

[11] Patent Number: 5,151,591
[45] Date of Patent: Sep. 29, 1992

[54] ASYNCHRONOUS SIGNAL INTERROGATION CIRCUIT FOR AN DETECTION APPARATUS

[75] Inventors: Donald D. Johnson, Pearl City; Jimmy Yee, Rockford, both of Ill.

[73] Assignee: Honeywell Inc., Minneapolis, Minn.

[21] Appl. No.: 702,566

[22] Filed: Mar. 20, 1991

[51] Int. Cl.$^5$ .................. H01J 40/14; H03K 5/19
[52] U.S. Cl. .................. 250/214 B; 250/222.1; 328/120
[58] Field of Search .................. 250/221, 222.1, 214 B, 250/223 R; 340/555, 556, 557; 328/120, 130.1; 307/522-524, 527-528

[56] References Cited

U.S. PATENT DOCUMENTS

| | | | |
|---|---|---|---|
| 4,381,446 | 4/1983 | Fukuyama et al. | 250/214 R |
| 4,434,363 | 2/1984 | Yorifuji et al. | 250/214 B |
| 4,516,020 | 5/1985 | Simpson et al. | 250/214.2 |
| 4,633,081 | 12/1986 | Hiramatu | 250/239 |
| 4,634,855 | 1/1987 | Friend et al. | 250/222.1 |
| 4,649,270 | 3/1987 | Goldenberg | 250/221 |
| 4,736,105 | 4/1988 | Funnesbeck | 328/120 |
| 4,973,834 | 11/1990 | Kim | 250/222.1 |
| 5,052,030 | 9/1991 | Ernst et al. | 328/120 |
| 5,057,683 | 10/1991 | Fukuyama | 250/214 B |

*Primary Examiner*—David C. Nelms
*Assistant Examiner*—Michael Messinger
*Attorney, Agent, or Firm*—William D. Lanyi

[57] ABSTRACT

An asynchronous photodetector circuit is provided to interrogate incoming signals and determine whether the frequency of those incoming signal pulses is acceptable. The circuitry of the present invention permits a series of incoming pulses to be interrogated to determine whether the frequency of those pulses is acceptable and can be assumed with confidence to be emanating from an appropriate light source. Upon the receipt of a first input signal pulse, a time window is created by the present invention to define a period to time during which a subsequent input signal pulse is to be expected. Other than during the duration of the time window, the present invention will not accept an input signal pulse and will not count that pulse as having been received. Each properly received pulse creates a subsequent time window until a predetermined number of consecutive pulses is received during their time windows. When that predetermined number is received, a signal is provided. In a particularly preferred embodiment of the present invention, the signal that the predetermined number of consecutive pulses have been received is used to lower the threshold voltage of a comparator for the purpose of facilitating receipt of subsequent signals once the appropriateness of the incoming stream of pulses is determined.

14 Claims, 3 Drawing Sheets

ASYNCHRONOUS SIGNAL INTERROGATION CIRCUIT FOR AN DETECTION APPARATUS

BACKGROUND OF THE INVENTION

1. Field of the Invention

The present invention is generally related to signal interrogation devices and, more particularly, to an apparatus for receiving a plurality of input signal pulses and determining whether the input signal pulses are of an appropriate frequency for receipt of a signal representing light pulses directed toward a photodetector apparatus.

2. Description of the Prior Art

Many types of photodetectors are known to those skilled in the art. For example, British patent 1,292,553, which Was published on Oct. 11, 1972, discloses an optical sensing system that is useable in ambient light. The disclosed device utilizes ultraviolet light and an associated photodetector which is sensitive to ultraviolet light. Both the light source and the photodetector are positioned on one side of a conveyor belt and another ultraviolet light source and associated photodetector means are positioned on the other side of the belt so that the label of a container will be exposed to the light source and sensed irrespective of its position. This British patent is one example of a photodetector system that utilizes pulsing light to permit the circuitry to distinguish proper between light signals emanating from the light source and ambient light or light from inappropriate light sources.

U.S. Pat. No. 4,649,270, which issued to Goldenberg on Mar. 10, 1987, discloses a photoelectric object detector which has a removable field stop means. This patent discloses a pulsed LED photoelectric control apparatus which operates in both a proximity mode and the retroreflective mode. Field stop elements are manually inserted for operation in the retro-reflective mode and are quickly and readily removed for operation in the proximity mode in order to enable the same photoelectric control apparatus to be utilized in both modes. This patent no only describes the concept of pulsing light to a light sensitive device, such as a photoelectric object detector, but also illustrates one of the several arrangements that can be used to detect objects. Some applications utilizes a retro-reflector target that causes light to reflect back toward a photo sensitive apparatus after being provided by a light source which is located on the same side of the detected object as the light sensitive apparatus.

U.S. Pat. No. 4,634,855, which issued to Friend et al on Jan. 6, 1987, discloses a photoelectric article sensor with facing reflectors. The device provides a sensor for counting articles, such as seeds, which are moving through a conduit. It includes an array of infra-red LED's generating a uniform diffuse beam of radiation which entirely illuminates a cross sectional volume of the conduit. The beam is detected by a planer photo diode which extends across the opposite side of the conduit. A pair of mirrors extend along opposite sides of the conduit between the array and the photo diodes.

U.S. Pat. No. 4,633,081, which issued to Hiramatu on Dec. 30, 1986, discloses a photoelectric switch which comprises a light projecting part, a light receiving part and a control part for controlling these parts. The light projecting part and the light receiving part are fixed in mounting holes. This patent is an example of a photoelectric arrangement in which the light source is disposed on the opposite side of the detectable object from the light receiving apparatus.

U.S. Pat. No. 4,516,020, which issued to Simpson et al on May 7, 1985, describes a light- operated proximity detector with a linear output. Reflected light from a surface whose proximity to the detector is to be gauged is translated directly into a signal proportional to the distance of the detector from the surface. A phototransistor is used to sense the reflected light and is connected in a detector circuit which maintains the phototransistor in a saturated state. A negative feedback arrangement using an operational amplifier connected between the collector and emitter of the transistor provides an output at the output of the amplifier which is linearly proportional to the proximity of the surface to the detector containing the transistor.

U.S. Pat. No. 4,381,446, which issued to Fukuyama et al on Apr. 26, 1983, describes a photoelectric switch which comprises a light projecting segment that includes a pulse oscillator and a light emitting element adapted to give a pulse light emission in response to an output pulse of the pulse oscillator. It has a light reception segment which includes a light reception element that is adapted to yield a light reception signal on incidence of light. Furthermore, it provides a gate circuit that is adapted to gate the light reception signal according to the output pulse of the pulse oscillator and an integration circuit for integrating outputs of the gate circuit. It also provides a control circuit for varying the pulse frequency by controlling the pulse oscillator on generation of a light reception signal from the light reception element.

In certain applications of photodetectors, the light source is disposed on one side of an object to be detected and a light sensitive apparatus is disposed on the opposite side of an object which is to be detected. If the particular application permits, a signal line can be extended between the light source and the detector s that the light pulses emanating from the light source can be synchronized precisely with the circuitry of the detector so that the light sensitive apparatus can accurately and definitely determine whether the pulses received ar coincident with the pulses sent by the light source. In this way, extraneous light pulses can be ignored and the combination of the light source and the photodetector can accurately and positively determine whether or not an object is disposed between them. Certain applications, however, restrict the use of a signal line between the light source and the photodetector. Therefore, the photodetector sometimes can not be provided with a definite indication of the transmission of light pulses from the light source. Some means must be used to determine whether the received light pulses are being transmitted from the light source or are extraneous.

Known systems typically receive the light pulses, amplify them and compare the magnitude of the incoming light pulses to a minimum threshold level. If the incoming light pulses exceed the magnitude of the threshold, they are provided at an input of a one-shot which, in turn, provides an output pulse of a specified duration. That output pulse is then sent to a capacitive circuit which utilizes the energy received from the one-shot to partially charge a capacitor. After the termination of the one-shot output, the capacitor begins to discharge at a predefined rate which is dependent on the circuit components. As additional subsequent pulses are received, amplified and provided to the one-shot, the capacitor is sequentially provided with additional partial charges. The circuit components are selected to permit the capacitor to be sequentially charged, in steps, at a rate which is faster than the ability of the capacitor to discharge between received pulses. After the capacitor receives a sufficient number of step charges from the one-shot, a device is used to signify the fact that the magnitude of charge on the capacitor has exceeded a predefined threshold. This device can be an apparatus such as a Schmitt trigger. When an output from the Schmitt trigger occurs, it provides an indication that a sufficient number of light pulses have been received to indicate that the light pulses are of the appropriate frequency and number to indicate, with a high degree of probability, that the light pulses are being sent by the light source associated with the photodetector.

As can be imagined, a device such as that described immediately above requires a predetermined number of consecutive pulses before the capacitor charge is sufficient to cause an output from the Schmitt trigger. This is necessary to make sure that the pulses aren't random and extraneous but, instead, are pulses provided by the appropriate light source. In most applications known to those skilled in the art, a significant number of pulses must be received before the circuit determines that the light pulses are from an appropriate light source. These known applications require a significantly large number of received pulses, as described above, because they do not discriminate upon each individual pulse whether that particular pulse in an appropriate pulse or merely the result of noise. This lack of discrimination necessitates a larger number of pulses to be received before the system can be sufficiently confident that the series of pulses actually emanated from the expected source. In some applications, the required number of light pulses exceeds thirty before the circuit provides a signal indicating the receipt of pulses of an appropriate frequency. It should be clearly understood that extraneous pulses received by devices such as photodetectors are not always extraneous light pulses but, instead, are very frequently caused by electromagnetic interference (EMI) or radio frequency interference (RFI) pulses. Therefore, when a photodetector is monitoring incoming signal pulses caused by light emanating from another device, extraneous pulses can be received either by other sources of light or from sources of electromagnetic or radio frequency interference. In fact, in many applications, the electronic interference is more likely to present a problem than the receipt of extraneous light pulses from the surroundings of the photodetector. The reduction in the number of consecutive pulses necessary to discriminate appropriate light pulses from noise can be achieved if a system is developed which is significantly more discriminatory during the receipt of signals. That type of improved system could significantly increase the speed by which a photodetector determines the appropriateness of a series of light pulses under conditions which are similar to that which would require many more pulses for devices known in the prior art to make that same determination. In certain applications, the time necessary to receive the predetermined number of pulses is too great to permit the system to work properly. For example, if objects are rapidly moving through the sensing zone, the system may not have sufficient time to resynchronize during the brief period of time when light is received by the photodetector between the passing of the objects through the sensing zone. A system which reduces the number of consecutive pulses that must be received before a photodetector can confidently determine that the light pulses are from the appropriate light source would permit photodetector systems to work more rapidly and without the need for a large number of light pulses to be received before the detection circuit can confidently decide that the light pulses are proper and appropriate.

SUMMARY OF THE INVENTION

An asynchronous photodetector circuit is provided by the present invention which interrogates incoming signals with a high degree of discrimination for the purpose of determining whether or not the frequency of the incoming signals is acceptable. After an initial signal is received by the present invention, it creates a time window during which a subsequent pulse in expected to occur if the signals are of the appropriate frequency. The present invention ignores all other pulses which occur during times other than this predefined duration of the acceptable window. By operating in this manner, the present invention essentially raises the signal-to-noise ratio by ignoring all incoming signals that occur at times when the appropriate signals aren't expected. By ignoring all incoming signals other than those which occur during the appropriate time windows, the present invention significantly raises the level of discrimination applied to each incoming pulse and therefore raises the confidence level that each pulse received during the time window is an appropriate pulse from the expected source. This highly increased confidence level permits the present invention to make a decision of acceptability regarding the incoming stream of signals based on fewer samples since each of the fewer samples has already passed a stringent requirement that it be received during an acceptable time window measured from the receipt of the previous acceptable pulse. This higher confidence level and reduced number of required pulses, in turn, permit the present invention to decide on the acceptability or unacceptability of a stream of incoming pulses much quicker than systems known to those skilled in the art. This ability to make the decision quicker under conditions similar to those which would require much larger periods of time for prior art devices to make this decision provides a significant advantage in that it allows the present invention to utilize much less time in deciding whether or not an acquired signal is being received from the appropriate light source. This higher speed of acquisition is the result of the higher level of discrimination used to interrogate each incoming pulse that is received by the circuitry of the present invention.

The present invention operates by receiving a first input signal pulse and then determining an appropriate window of time during which a subsequent input signal pulse must be received if the signal pulses are to be assumed to be from the appropriate light source and being transmitted at the appropriate frequency. If a subsequent light pulse signal is received during the allotted time period, the present invention repeats the process to create a new window of time during which a third light pulse must be received if the pulses are of the appropriate frequency. This process continues until a predetermined number of pulses are received in the appropriate windows, or periods, of time. By ignoring light pulses which do not occur during the time windows, the present invention increases the probability that a relatively small number of properly received signals indicates that the signals are of the appropriate frequency and from the appropriate light source.

A preferred embodiment of the present invention provides a signal interrogation apparatus that comprises a means for receiving input signal pulses. Typically, the receiving means would comprise a portion of a circuit that receives electrical signals from an amplifier which, in turn, receives electrical signals from a photodetector. The present invention also comprises a means for defining an acceptable time period having a predefined length or duration in which the acceptable time period begins after a predefined length of time following receipt of a firs input signal pulse. The present invention also comprises a first means for providing a first record signal in response to receipt of a second input signal pulse that is coincident with the acceptable time period. The second input signal pulse is subsequent to the first signal input pulse which was used by the present invention to define the acceptable time period. The present invention also comprises a second means for providing a second record signal in response to a lack of receipt of the second input signal pulse coincident with the acceptable time period.

In a particularly preferred embodiment of the present invention, the first and second record pulses are stored and used to determine whether or not a predefined number of sequential pulses of the same state have been received. In other words, in one particular preferred embodiment of the present invention a four-input AND gate is used to provide an output representing the receipt of four consecutive input signal pulses that are coincident with acceptable time windows. The four inputs of the AND gate are connected to outputs from a shift register that is used to record the status or signal level of the most previous four consecutive signal pulses. The four outputs from the shift register are also connected to a four input NOR gate. The output of the AND gate is connected to the set input of a flip-flop and the output of the NOR gate is connected to the reset input of the flip-flop. The output of the flip-flop represents the signal level, or state, of the signals which last occurred in a sequence of four consecutive signals of the same type. In other words, if four consecutive proper input signals are received, wherein each of the four consecutive input signal pulses occurred during an appropriate time period or window, the output of the flip-flop will represent a logically high signal. On the other hand, if four consecutive time periods or windows have passed without receipt of a signal pulse coincident with the windows, the output of the flip-flop will be of a logically low state. Any other combination of occurrences, which do not comprise four consecutive occurrences of the same type, will not change the output of the flip-flop.

In a most preferred embodiment of the present invention the output of the flip-flop is used to not only indicate the occurrence of the four consecutive light pulses of the same status but, in addition, to lower the reference voltage threshold following receipt of the four consecutive pulses. This characteristic of the present invention increases the likelihood of receiving input signals after it has been determined that four consecutive proper signals have been received. This improves the likelihood of receiving subsequent signals because of the fact that it has been determined that signals appear to be proper and appropriate. Before receipt of four proper input signal pulses the higher threshold is more discriminative during initial receipt of input signals which have not yet been determined to be emanating from a proper light source.

BRIEF DESCRIPTION OF THE DRAWING

The present invention will be more fully/understood from a reading of the description of the preferred embodiment in conjunction with the drawings, in which.

DESCRIPTION OF THE PREFERRED EMBODIMENT

Figure 1:
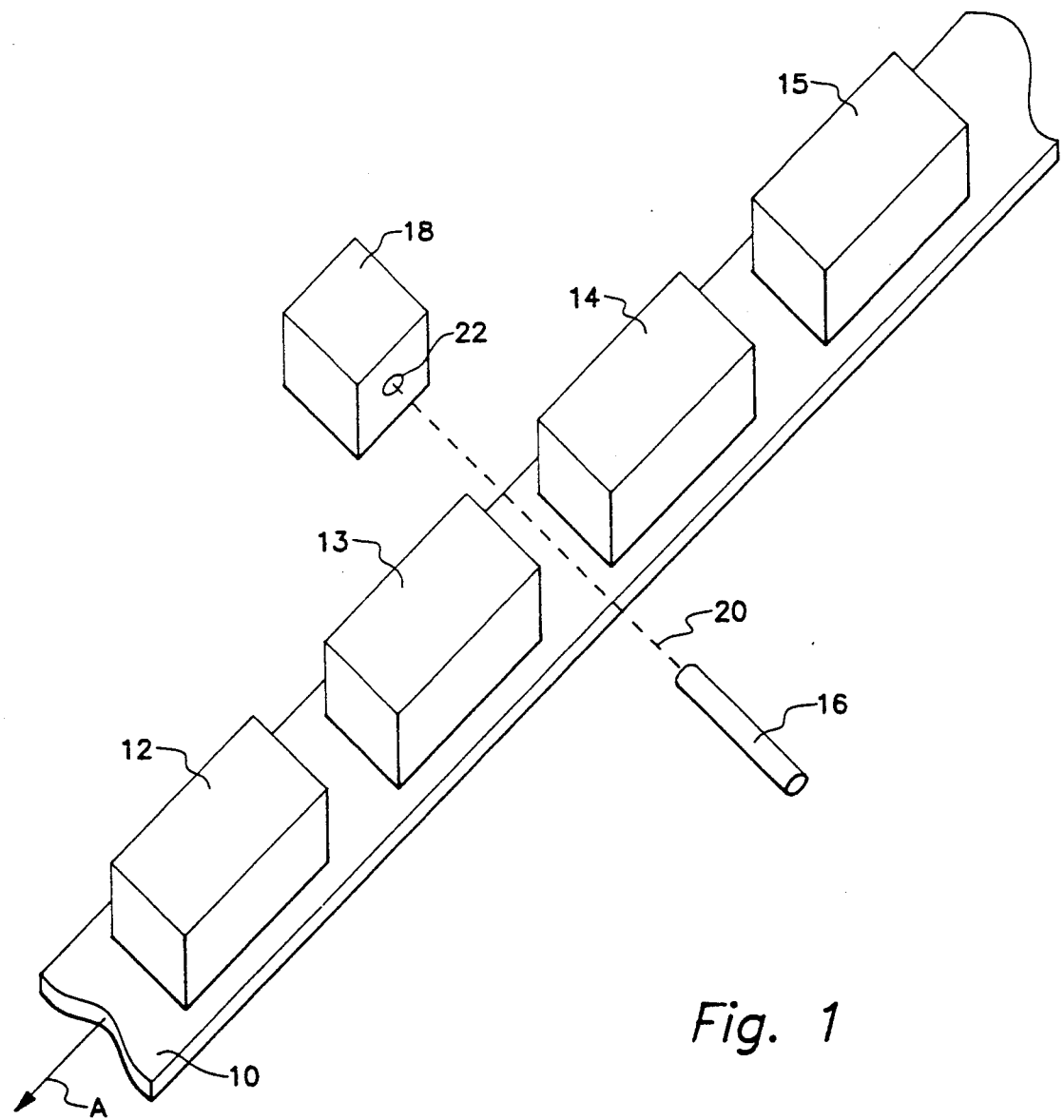
FIG. 1 illustrates a typical application where a light source is placed on one side of an object to be sensed and a light receiving apparatus is placed on the opposite side of the object to be sensed.

Throughout the description of the preferred embodiment of the present invention, like reference numerals will be used to describe like objects.

FIG. 1 illustrates a typical situation in which a photodetector is used to detect the presence or absence of an object. In FIG. 1, a conveyor belt 10 is used to carry a plurality of objects in a direction indicated by arrow A. The objects are identified by reference numerals 12-15 and are shown on the conveyor belt 10 for movement in the direction of arrow A. A light source, which is schematically illustrated by cylinder 16, is disposed on one side of the conveyor belt 10. On the other side of the conveyor belt 10, a photodetector apparatus 18 is disposed. The light source 16 and the photodetector apparatus 18 are aligned so that a light beam 20 emanating from the light source 16 will be received at an appropriate aperture 22 of the photodetector device 18. As is well known to those skilled in the art, the light beam 20 can comprise a series of light pulses.

In many applications of the type shown in FIG. 1, with the light source 16 and the photodetector 18 placed on opposite sides of the object to be sensed, signal lines can be used to connect the light source to the photodetector. These signal lines can be used to synchronize the occurrence of the output light pulses from the light source 16 with the circuitry of the photodetector 18 used to receive the light pulses. This type of system allows the light pulse receiving circuitry to know when a pulse is expected to be received from the light source 16. In that way, extraneous light pulses from sources other than light source 16 can be ignored. Any light pulse signal received at a time which is not coincident with a signal received from the light source 16, indicating that a light pulse has been sent, is therefore ignored. The processing of input light signals in this way is relatively straight forward and very well know to those skilled in the art.

Systems such as that illustrated in FIG. 1 can present a significant problem if it is impossible or impractical to extend signal lines between the light source 16 and the photodetector 18. The absence of signal lines prevents the light source circuitry from informing light receiving circuitry that a light pulse has been sent. When an input signal pulse is received by the photodetector 18, the circuitry of the photodetector can not be sure that the received pulse emanated from the proper and appropriate light source 16 or, alternatively, emanated from the ambient surroundings or an improper light source other than that identified by reference numeral 16. Some means must be used to interrogate the incoming light pulses and determine whether or not they are emanating from the appropriate light source 16.

According to techniques known to those skilled in the art, one system for interrogating incoming light pulses comprises a mean for charging a capacitor upon the receipt of each pulse. The capacitor is arranged in the circuit to have a charge time that is must faster than its discharge time. Therefore, if a series of pulses are received within a predefined period of time, the capacitor charge increases in a step function to a predetermined magnitude and that magnitude is sufficient to create an output signal which is used to indicate the appropriate receipt of light pulses from a proper light source. This technique presents many incumbent problems. First, a series of rapid sequential light pulses from an improper source can raise the charge on the capacitor above the threshold level and create an output signal even though the light pulses did not emanate from the appropriate light source. In addition, even when the light sources are provided by the appropriate light source 16, a relatively large number of sequentially received input light pulses are required before the receiving circuitry can be sure that the light pulses are coming from the proper source. Because of the inherent weaknesses in this type of system, some circuits require as many as thirty consecutive proper input signal pulses before the circuitry determines that the input pulses are from the appropriate source. This high number of pulses required to determine the appropriateness of the input signals with confidence requires a period of time that is not acceptable in some applications. With continued reference to FIG. 1, it is easy to imagine a speed of the conveyor belt 10 combined with a close proximity of the objects 12–15 to be sensed which does not permit sufficient time with light passing between the objects for the circuitry to confidently determine that a sufficient number of pulses have been received to indicate that a light beam 20 is emanating from the proper source 16.

The present invention is directed toward an improvement in a signal interrogation circuit for use in a photodetector such as that identified by reference numeral 18 in FIG. 1. It is intended to operate with a light source 16 which is not connected in electrical communication with the photodetector 18. Furthermore, the present invention is intended to reduce the required number of sequential proper pulses for the interrogation circuitry to be able to deduce that the pulses are, indeed emanating from the proper source at the proper frequency.

Figure 2:
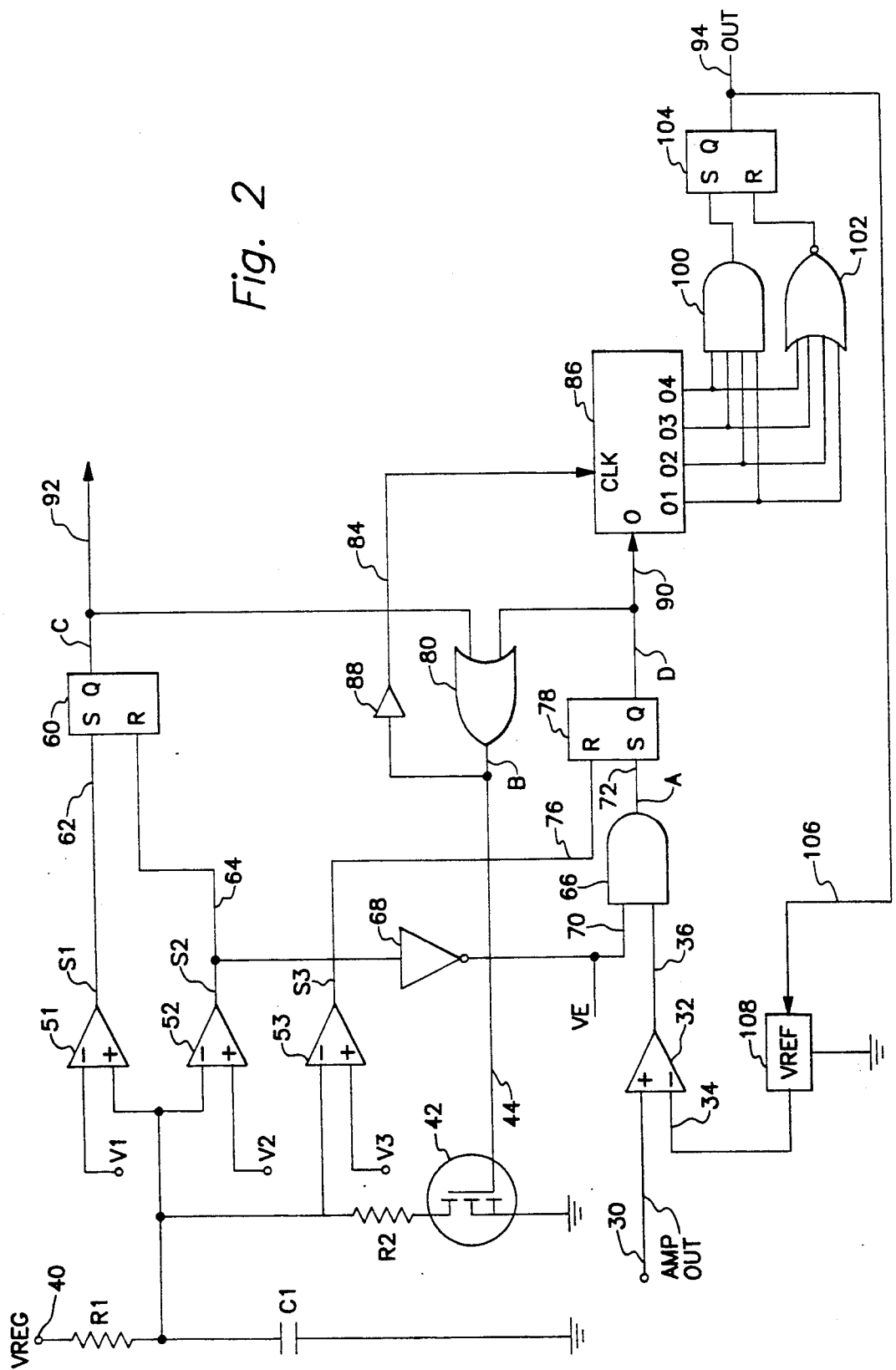
FIG. 2 illustrates a preferred embodiment of the present invention.

With reference to FIG. 2, the present invention provides a means for receiving input signal pulses. In FIG. 2, that means is illustrated as a signal line 30 which is connected to an amplifier (not shown in FIG. 2) which, in turn, is connected to the output of a photo sensitive device. The amplifier amplifies the received signal and provides it to line 30 in FIG. 2. The incoming signal occurs as a pulse and is provided as an input to the non-inverting input of comparator 32. Therefore, if the magnitude of the signal pulse on line 30 exceeds the magnitude of a reference pulse on line 34, the comparator 32 will provide an output signal on line 36. A signal on line 36 therefore represents the occurrence of an input signal pulse which exceeds the magnitude of the voltage reference on line 34. With continued reference to FIG. 2, it can also be seen that a regulated voltage is provided at point 40 and the regulated voltage can charge capacitor C1 through resistor R1. The charge on capacitor C1 is dependent on the status of the field effect transistor 42. When the gate terminal of field effect transistor 42 is energized, a path from capacitor C1 to ground is provided through resistor R2.

The values of resistors R1 and R2 are chosen, in a preferred embodiment of the present invention, to result in a relatively slow rise in the charge of capacitor C1 accompanied by a relatively rapid discharge of capacitor C1 when the gate 44 of the FET 42 is energized. Therefore, if the gate 44 of the FET 42 is not energized, the charge on the capacitor C1 will rise at a predetermined rate as a function of the values of the related circuit components. However, when the gate 44 of the FET 42 is energized, current will flow from the capacitor C1 through resistor R2 to the drain of the FET 42 and to ground through the source of FET 42. By appropriately selecting the magnitudes of the capacitor C1 and resistors R1 and R2, the sequential charging and discharging of capacitor C1 can be used to provide appropriate time periods for use by the other components in the circuit of FIG. 2.

Comparators 51, 52 and 53 are used to react to different levels of voltage at capacitor C1. As can be seen, the inverting input of comparator 51 is connected to a voltage source having a magnitude identified by V1. Comparator 52 has its non-inverting input connected to a voltage source having a magnitude identified by V2 and comparator 53 has its non-inverting input connected to a voltage source having a magnitude of V3. In a preferred embodiment of the present invention, the magnitude of V1 is greater than the magnitude of V2 and the magnitude of V2 is greater than the magnitude of V3. The outputs of the comparators 51, 52, and 53 have been identified as S1, S2 and S3, respectively.

The output S1 from comparator 51 is connected to the set input of flip-flop 60 by line 62. In addition, the output S2 of comparator 52 is connected to the reset input of flip-flop 60 by line 64. It should also be noted that output S2 is connected to one input of AND gate 66 through an invertor 68. The inverted version of signal S2 is identified as signal VE. Signal VE is provided as an input on line 70 to AND gate 66. The other input to the AND gate 66 is from the comparator 32 on line 36 as described above. Therefore, it should be understood that the occurrence of a signal pulse on line 36 at a time when signal VE, on line 70 is high will result in a signal A on line 72.

Signal S3 from comparator 53 is provided as a reset input on line 76 to flip-flop 78. Signal A on line 72 is provided as the set input of flip-flop 78.

The output of flip-flop 60, which is identified as signal C, is connected a one input to OR gate 80. The output of flip-flop 78, which is identified as signal D, is connected to the other input of OR gate 80. The output of OR gate 80 is identified as signal B and is connected to the gate of the FET 42 on line 44.

Signal B is also provided, on line 84, to a clock input of a shift register 86 after being delayed by device 88. As can also be seen in FIG. 2, shift register 86 is provided with an input, at its data port, of signal D on line 90. The status of signal D is clocked into the flip-flop 86 by the delayed signal B on line 84 to sequentially set the statuses of four output ports that are labeled Q1–Q4 in FIG. 4. It can also be seen in FIG. 2 that line 92 provides an oscillator output from the device which can be used for many different purposes unrelated to the present invention. In addition, line 94 provides an output which indicates, by its state, the occurrence of a predetermined number of signal pulses of the same signal level during a predetermined time period which will be described in greater detail below.

With reference to the shift register 86, the four outputs Q1–Q4 are connected to the inputs of an AND gate 100 and an NOR gate 102. The AND gate 100 is connected to the set input of flip-flop 104 and the output of the NOR 102 is connected to the reset input of flip-flop 104. The output of flip-flop 104 is also the output of the device on line 94. In addition, it can be seen in FIG. 2 that the output of this flip-flop 104 is used to determine the magnitude of the voltage reference provided on line 34 to the inverting input of comparator 32. In a typical application of the present invention, the output on line 106 would work in conjunction with a voltage reference device 108 to determine one of two appropriate voltage magnitudes based on the signal level on line 106. As can be seen, if all of the outputs of the shift register are logically high, the output of AND gate 100 will be high and the flip-flop 104 will be set to provide a logically high output on line 94. Conversely, if all of the outputs of the shift register 86 are low, the output from the NOR gate 102 will be high and flip-flop 104 will be reset to provide a logically low output on line 94. Since the outputs from ports Q1–Q4 of the shift register 84 represent the states of the last four pulse periods defined by the circuit in FIG. 2, they also represent the last four states, defined as acceptable or unacceptable, determined by the circuit of the present invention. If the last four states are acceptable, outputs Q1–Q4 are high and AND gate 100 will provide a high signal indicating that the interrogating circuitry has determined that four proper signals have been received consecutively without any unacceptable signals being received. On the other hand, if all four outputs are low, representing four consecutive receipts of unacceptable signals, the four inputs to the NOR gate 102 will be low and the flip-flop 104 will be reset. Therefore, four consecutive acceptable signals will set flip-flop 104 and four consecutive unacceptable signals will reset flip-flop 104. Any combination other than these consecutive signals described above will not change the status of the output of flip-flop 104 on line 94.

With continued reference to FIG. 2, it should be noted that one significant advantage of the present invention is that when it provides an output signal on line 94 to indicate whether the last sequence of four identical state pulses were pulses of a high state or a low state, it also provides that same signal on line 106 to the device identified as VREF 108. The output of VREF 108 is a signal, on line 34, which acts as the threshold for the comparator 32. When the output on line 106, from flip-flop 104, is low the output signal from VREF 108 is the higher of two voltage magnitudes. When the signal from flip-flop 104, on line 106, is high the output from VREF 108 is the lower of two magnitudes. By operating in this manner, the present invention lower the required threshold used by comparator 32 after four acceptable signals have been received consecutively, as indicated by shift register 86. In other words, after the present invention determines that a proper signal has been acquired, it lowers the threshold for future pulses to improve the probability that additional signals will be appropriately received. This can be done in view of the fact that the system has achieved a certain level of confidence that the incoming signals are appropriate and from the proper source. On the other hand, if the present invention determines that the four most recent acceptable time windows did not coincide with the receipt of a signal pulse, it provides a low output on line 106 which, in turn, raises the threshold at the inverting of comparator 32. This raises the required signal level required for incoming pulses to be determined appropriate until the present invention determines that four consecutive signals are received during the appropriate time windows as reflected by the output of the switch register 86 in the method described above.

Figure 3:
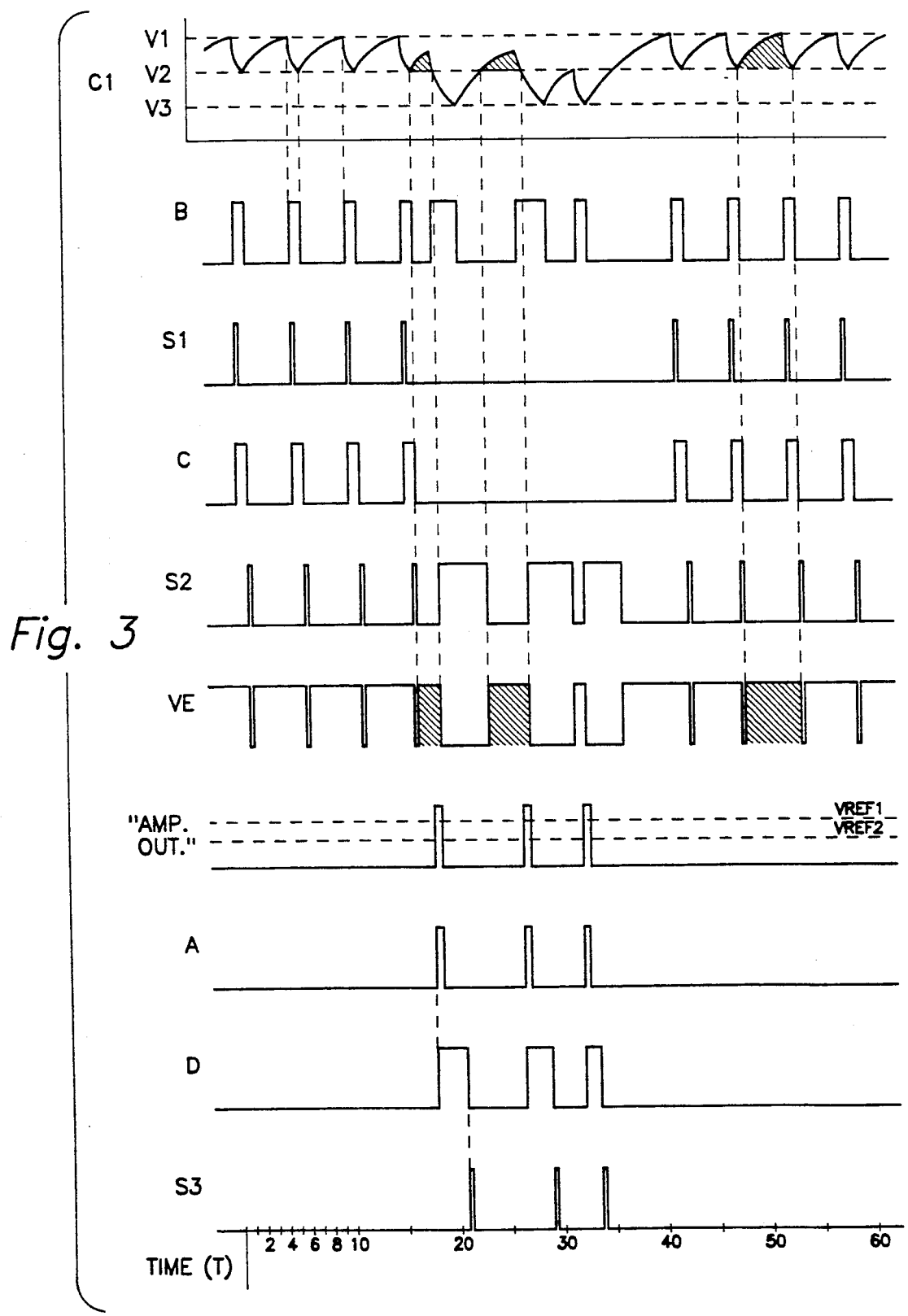
FIG. 3 illustrates numerous timing diagrams illustrating the relative signal values at several points in the circuit of FIG. 2.

FIG. 3 illustrates a series of timing diagrams that represent the signal levels or voltage levels of the components shown in FIG. 2. FIG. 2 and 3 should be viewed together to understand the sequential operation of the circuit in FIG. 2. In FIG. 3, the various timing diagrams are illustrated in an order from top to bottom to most conveniently represent signals which are closely associated with each other proximate to each other in the figure for the purpose of simplifying the comparison of the signals and appreciating the interaction of the signals.

At the top of FIG. 3, the charge level of capacitor C1 is illustrated as a function of time. As can be seen in FIG. 3, a time line T is provided to facilitate the description of the signals. However, it should be understood that numerical representations on the time line T do not represent specific periods of time but, instead, are used solely for the purpose of demonstrating the relative changes in signal level as various coincident times throughout the operation of FIG. 2.

Signal B, which is the output from the OR gate 80, controls the gate of the FET 42 on line 44. It therefore also controls the discharge of the capacitor 51. In other words, when signal is high the FET 42 is conductive and therefore drains capacitor C1 to ground through resistor R2. This can be seen by comparing the status of signal B with the charge level on capacitor C1. Each time signal B is high, the capacitor is caused to discharge from its present magnitude toward complete discharge until signal B is removed from the gate of FET 42. By observing the circuit in FIG. 2, it can be seen that the output of NOR gate 80 is dependent on signals C or D from flip-flops 60 or 78, respectively. Therefore, if the outputs from either of the flip-flops, 60 or 78, is logically high the capacitor C1 is caused to be discharged because signal B will provide a gate signal on line 44 to the FET 42.

With continued reference to FIG. 3, signal S1 is coincident with the rise in signal C at the output of flip-flop 60. In a related manner, signal S2 is coincident with the fall of signal C. The relationship between signals S1, S2 and C are normal to the operation of flip-flop 60. It should be noted that the durations of the pulses of signal S2 are coincident with the duration when the charge on capacitor C1 is less than the value of V2. The pulses of very short duration, such as at times T1, T6 or T12 are extremely short because of the fact that the capacitor is immediately recharged when its charge is reduced to a magnitude equal to V2 unless pulses are received on line 30 from the amplifier output of a light receiving device. However, as can be seen between times T19 and T24, signal S2 can also remain logically high for a longer duration.

With continued reference to FIG. 3 and signal S2, it should be noted that signal S2 is inverted by invertor 68 to form signal VE. As can be seen in FIG. 3, these two signals are always complimentary to each other. Therefore, it should also be noted that signal VE is logically high while the charge on capacitor C1 is above the magnitude of V2. For purposes of emphasis, three of these periods are marked with cross-hatching on both signal VE and the capacitor charge C1. For example, between T17 and T20 the duration of the VE signal pulse is coincident with the time the charge C1 is greater than V2. Similarly, between time T24 and T28 the duration of signal VE is coincident with the time that the capacitor charge C1 is greater than V2. This can also be seen between time T47 and T53.

For purposes of this illustration, three exemplary pulses at the AMP. OUT. input on line 30 are shown. These input pulses are illustrated for purposes of showing their affect on the circuit of the present invention and the response of the present invention in determining appropriate time windows for subsequent pulses. When the first input pulse is received at time T19, it is followed by several predefined responses. First, it can be seen that the input signal was received at a time when signal VE was high. This caused an output signal A from AND gate 66. For purposes of fully understanding the invention, it should be noted that prior to receipt of the input signal on line 30, the magnitude of signal VE was high for a vast majority of the time and was only low during the extremely brief periods of time when the capacitor charge is reduced to the value of V2 prior to immediately being recharged. This characteristic of signal VE increases the probability that an input signal on line 30 will be received at a time when signal VE is high. When signal A is received by flip-flop 78, signal D is provided. Signal D will remain high until flip-flop 78 is reset by a signal on line 76 from comparator 53. That signal is identified by S3 in FIG. 2. When signal D is high, a high signal will be clocked into the shift register 86 for purposes of retaining a record of its occurrence. However, it should also be noted that the high state of signal D also causes OR gate 80 to provide signal B to the gate of FET 42. This immediately begins to drain the capacitor of its charge. This can be seen at time T19 when the capacitor C1 was being charged between time T17 and the occurrence of the input pulse at approximately time T19. At this time, the charge on the capacitor was between the magnitudes of V2 and V1. Immediately upon receipt of the input pulse, the sequential signals were provided to result in the discharge of the capacitor through FET 42. When the capacitor charge decreased below V2, the level of signal VE was reduced to zero and remained at zero until the charge on the capacitor again rose above V2. It should be noted that the charge on capacitor C1 exceeded V2 at approximately time T24 at which time signal VE was caused to rise. Signal VE would be expected to remain high until the charge on the capacitor C1 again decreased below V2. Normally, if no additional input signals are received, this would require the capacitor to charge to V1 and be discharged again to a magnitude below V2. However, during the period of time when signal VE is high, a subsequent consecutive input signal on line 30 will immediately cause capacitive C1 to discharge for the purpose of creating a new window of time during which a signal is expected to be received. This can be seen at time T27 when a second input pulse is received on line 30. That input pulse immediately causes the charge on capacitor C1 to be stopped and a discharge to begin. It should be understood that the occurrence of the input signal on line 30 is coincident with the peak of the capacitor charge at time T17. Subsequent to the receipt of that signal, the charge in capacitor C1 drops until it passes below V2 between time T17 and time T18. The reduction in charge below V2 causes signal VE to drop to zero until the charge on the capacitor C1 again rises above V2. That rise above V2 occurs between time T31 and T32 and, as a result, the magnitude of signal VE is caused to rise to begin another window of time when a subsequent signal will be received. At approximately time T32, a third signal is received on line 30 and the sequence is repeated.

With reference to FIG. 2, the sequence of events described above would result in outputs Q1, Q2 and Q3 of shift register 86 being high. If one more consecutive signal is received on line 30 during the appropriate time window without an intermediate time window being missed by a signal on line 30, the output of AND gate 100 will be high and flip-flop 104 will be set. However, the illustration shown in FIG. 3 illustrates that during the window of signal VE which begins at time T36 and ends between time T41 and T42, no input signal is received on line 30. Therefore, when signal C emanates from flip-flop 60 because of the fact that the charge on the capacitor reached a magnitude of V1, a zero is clocked into the shift register 86, depriving the AND gate 100 of its four consecutive logically high signals needed to set flip-flop 104. Had the output of flip-flop 104 been set to a logically high magnitude, that signal on line 106, in cooperation with device 108, would lower the magnitude of the voltage on line 34 at the inverting input of comparator 32 to that identified by the dashed line VREF2 in FIG. 3 from the initial magnitude VREF1. The purpose of the change in the reference at the inverting input of comparator 32 has been described above.

With continued reference to both FIGS. 2 and 3, several characteristics of the circuit in FIG. 2 will be described. First, it should be noted that flip-flop 60 operates as a oscillator with signal C serving to clock data into the shift register 86 if the capacitor is permitted to rise to the magnitude of V1. This can be seen in the initial time periods of FIG. 3 when the charge on capacitive C1 oscillates between V1 and V2. It should also be noted that the duration of signal VE in a high state is determined by the time during which the charge on capacitor C1 is above V2. The window of acceptability provided by signal VE will last for a predetermined period of time which is a function of the values of resistors R1 and R2 in association with the value of capacitor C1. That time, in FIG. 3, can reach a maximum value determined by the time which the capacitor charge remains above V2. The maximum duration of signal VE in a high state is illustrated between times T47 and T53. The minimum time of signal VE being in a high state is determined by the occurrence of a signal on line 30. This can be seen by the abrupt termination of signal VE at time 19 when the first signal is received on line 30. Although the width of the time windows has been illustrated in FIG. 3 as significantly wider than the incoming pulses, it should be clearly understood that these relative sizes have been used solely for the purpose of describing the sequence of events represented by the timing diagrams in FIG. 3. In most applications of the present invention, the time duration of signal VE, or the duration of the time window, would be only slightly greater than the expected width of the signal pulses being received. In a likely embodiment of the present invention, the time duration of signal VE would be longer than the time duration of the expected input pulse, but probably not twice as long as that expected input pulse. Therefore, once a first input pulse is received the duration of the time window of acceptability is held to a magnitude only slightly greater than the expected incoming pulses itself. This raises the level of discrimination applied to the incoming pulses and interrogates the incoming pulses according to a very strict criterion. This high level of discrimination significantly raises the confidence level of the present invention that the received pulse occurred at precisely the expected time and is therefore likely to be an appropriate and proper pulse.

Each time a signal is received on line 30, the present invention provides the creation of a time window during which a signal pulse on line 30 will be observed and recognized. If that signal does not occur during the time window when signal VE is high, the signal will not be recognized. Therefore, it should be seen that the present invention provides a window of acceptability based on the expected frequency of an input signal and only recognizes input signal pulses that occur during that window of acceptability. By raising the standard of acceptability in this way, the circuit of the present invention can afford to rely on a lesser number of received pulses. This is a result of the fact that each received pulse has already passed an initial standard which required it to occur during a predetermined period of time. By requiring fewer number of sequential pulses to ascertain the appropriateness of an incoming signal, the present invention requires less time to synchronize a photodetector receiving circuit with a light source.

Although the present invention has been described with significant specificity and a particularly preferred embodiment of the present invention has been illustrated in detail, it should be understood that alternative embodiments of the present invention should be considered within its scope.

The embodiments of the invention in which an exclusive property or right is claimed are defined as follows:

1. A signal interrogation apparatus, comprising:
   means for receiving input signal pulses;
   means for defining an acceptable time period having a predefined length, said acceptable time period beginning a predefined time following receipt of a first input signal pulse;
   first means for providing a first record signal in response to receipt of a second input signal pulse coincident with said acceptable time period, said second input signal pulse being subsequent to said first input signal pulse;
   second means for providing a second record signal in response to a lack of receipt of said second input signal pulse coincident with said acceptable time period; and
   means for preventing receipt of said signal pulses by said defining means at times other than during said acceptable time period.

2. The apparatus of claim 1, further comprising:
   means for storing said first and second record signals.

3. The apparatus of claim 2, further comprising:
   first means for responding to an occurrence of a predefined number of consecutive first record signals.

4. The apparatus of claim 3, further comprising:
   second means for responding to an occurrence of a predefined number of consecutive second record signals.

5. A signal interrogation apparatus for a photodetector, comprising:
   means for receiving a series of input signal pulses;
   means for generating a reference pulse, said reference pulse having a predefined duration and beginning a predefined time after receipt of a fist one of said series of input signal pulses;
   means for providing a first status pulse, said first status pulse having a first state if a second input signal pulse is received coincident with said reference pulse, said first status pulse having a second state if said second input signal pulse is not received coincident with said reference pulse;
   means for recording said first status pulse; and
   means for preventing receipt of said input signal pulses by said generating means except during said duration of said reference pulse.

6. The apparatus of claim 5, further comprising:
   means for counting a plurality of occurrences of said first state of said status pulse.

7. The apparatus of claim 6, further comprising:
   means for counting a plurality of occurrences of said second state of said status pulse.

8. The apparatus of claim 7, further comprising:
   means for providing an output signal having a first state in response to a first predefined number of said plurality of occurrences of said second state of said status pulses and having a second state in response to a second predefined number of said plurality of occurrences of said first state of said status pulses.

9. The apparatus of claim 8, further comprising:
   means for lowering a threshold level used to compare with said input signal pulses.

10. A signal interrogation method comprising:
    receiving input signal pulses;
    defining an acceptable time period having a predefined length, said acceptable time period beginning a predefined time following receipt of a first input signal pulse;
    preventing receipt of said input signal pulses except during said acceptable time period;
    providing a first record signal in response to receipt of a second input signal pulse coincident with said acceptable time period, said second input signal pulse being subsequent to said first input signal pulse; and
    providing a second record signal in response to a lack of receipt of said second input signal pulse coincident with said acceptable time period.

11. A method of claim 10, further comprising:
    storing said first and second record signals.

12. The method of claim 11, further comprising:
    responding to an occurrence of a predefined number of consecutive first record signals.

13. The method of claim 12, further comprising:
    responding to an occurrence of a predefined number of consecutive second record signals.

14. The method of claim 13, further comprising:
    lowering a threshold level, in response to said predefined number of consecutive first record signals, used to compare with said input signal pulses.

* * * * *